(12) United States Patent
Park et al.

(10) Patent No.: US 12,120,912 B2
(45) Date of Patent: Oct. 15, 2024

(54) DISPLAY DEVICE HAVING LOWER DENSITY PIXELS IN AREA OVERLAPPING WITH CAMERA MODULE

(71) Applicant: LG Display Co., Ltd., Seoul (KR)

(72) Inventors: SungJin Park, Paju-si (KR); SangBin Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 16 days.

(21) Appl. No.: 17/530,154

(22) Filed: Nov. 18, 2021

(65) Prior Publication Data

US 2022/0199702 A1    Jun. 23, 2022

(30) Foreign Application Priority Data

Dec. 22, 2020    (KR) .................... 10-2020-0180376

(51) Int. Cl.
*H10K 59/121*    (2023.01)
*H10K 50/86*    (2023.01)
*H10K 59/126*    (2023.01)
*H10K 59/65*    (2023.01)

(52) U.S. Cl.
CPC .......... *H10K 59/121* (2023.02); *H10K 50/86* (2023.02); *H10K 59/126* (2023.02); *H10K 59/65* (2023.02)

(58) Field of Classification Search
CPC ............... H01L 27/326; H01L 27/3234; H01L 51/5281; H01L 27/3272
See application file for complete search history.

(56) References Cited

U.S. PATENT DOCUMENTS

| | | | |
|---|---|---|---|
| 2020/0052045 A1* | 2/2020 | Kuo | G09G 3/20 |
| 2021/0313539 A1* | 10/2021 | Jeon | H01L 51/5225 |
| 2021/0358969 A1* | 11/2021 | Wang | G09G 3/20 |
| 2021/0385314 A1* | 12/2021 | An | G02F 1/133512 |
| 2022/0165804 A1* | 5/2022 | Lee | H01L 27/3246 |
| 2022/0254849 A1* | 8/2022 | Lee | H10K 59/1213 |
| 2022/0336573 A1* | 10/2022 | Chen | H01L 27/3276 |

FOREIGN PATENT DOCUMENTS

WO    WO-2021227147 A1 *    11/2021    ........... G02F 1/1333

* cited by examiner

*Primary Examiner* — Suberr L Chi
(74) *Attorney, Agent, or Firm* — Fenwick & West LLP

(57) ABSTRACT

The present disclosure relates a display panel. The display device includes a plurality of first pixels disposed in a first area, a plurality of second pixels disposed in a second area surrounded by the first area, and a plurality of third pixels disposed in a third area between the first area and the second area.

11 Claims, 8 Drawing Sheets

DISPLAY DEVICE HAVING LOWER DENSITY PIXELS IN AREA OVERLAPPING WITH CAMERA MODULE

CROSS-REFERENCE TO RELATED APPLICATION

This application claims the priority benefit of Republic of Korea Patent Application No. 10-2020-0180376, filed on Dec. 22, 2020 in the Korean Intellectual Property Office, the disclosure of which is incorporated herein by reference in its entirety.

BACKGROUND

Field

The present disclosure relates to display devices.

Description of Related Art

Image display devices configured to display various information or data on a display screen act as a core device in the information and communication era. The display devices become thinner and lighter and are being developed to have high performance while being portable. Various needs for display devices for displaying an image have increased, and recently, various types of display devices, such as a Liquid Crystal Display (LCD) device, an Electroluminescence Display (ELD) device including a Quantum-dot Light Emitting Display device including a quantum dot (QD), an Inorganic Light Emitting Display device, and an Organic Light Emitting Display device, and the like have been developed and utilized.

Further, display devices are equipped with an input unit using a touch sensor or the like and an optical unit such as a camera, a proximity sensor, or the like in order to provide a user with more diverse application functions. However, due to the attachment of the optical unit to the display devices, there is a problem that the design of the display devices becomes difficult. In particular, since the camera and the proximity sensor are required to be exposed to the outside for the entrance and exit of light, there is a problem in that an active area of the display panel is inevitably reduced.

Accordingly, in some cases, a display device has been designed to i) have a large bezel for installation and exposure of an optical unit, ii) allow a portion of a display area to be cut out in a notch shape, or iii) allow the optical unit to be exposed through a hole-shape portion formed in the active area. However, because a size of a display screen is still limited due to the camera, it is not easy to implement a full-screen display in actual.

SUMMARY

To implement a full-screen display, there is proposed a scheme of assigning an imaging area in which low-resolution pixels are disposed in a display screen and arranging a camera and/or various sensors in a location or area facing the sensor area under the display panel. However, since the pixels are disposed in the imaging area, there is a problem that light transmittance is lowered, and the performance of the camera and/or such sensors is deteriorated. To address these issues, embodiments of the present disclosure provide display devices for allowing a larger amount of light to transmit toward an optical unit. Issues or problems for solving in the present disclosure are not limited thereto, and other issues or problems will become apparent to those skilled in the art from the following description.

In accordance with aspects of the present disclosure, a display device is provided. The display device includes a plurality of first pixels disposed in a first area, a plurality of second pixels disposed in a second area surrounded by the first area, and a plurality of third pixels disposed in a third area between the first area and the second area.

The second area may overlap a camera module, and a density of the second pixels disposed in the second area may be lower than that of the first pixels disposed in the first area.

A density of the third pixels disposed in the third area may be the same as the density of the second pixels disposed in the second area.

Each of the second pixels may include only a light emitting element in the second area, and a pixel circuit driving the light emitting device of each of the second pixels may be located in the third area.

The display device may further include a connection electrode connecting between the light emitting element in the second area and the pixel circuit in the third area corresponding to the light emitting element in the second area. The connection electrode may be formed of a transparent metal.

The pixel circuit for driving the light emitting element of each of the second pixels may have a structure different from a pixel circuit for driving a light emitting element of each of the third pixels.

The light emitting element of each of the third pixels and the pixel circuit for driving this light emitting element may be located in the third area.

The second area may include a light-transmitting area disposed between the second pixels, and a cathode of the light emitting element included in the second pixels may not be disposed in the light-transmitting area.

The third area may include a light-transmitting area disposed between the third pixels, and a cathode of the light emitting element included in the third pixels may not be disposed in the light-transmitting area.

Various specific features, configurations, techniques and processes are included in detailed description and the accompanying drawings, and will be discussed in detail below.

In accordance with aspects of the present disclosure, a display device equipped with an optical unit can be provided without decrease in a display area of an associated display panel. More specifically, according to embodiments described herein, light transmittance in an imaging area of the display device can be significantly increased. Further, according to embodiments described herein, it is possible to provide the display device having improved aesthetics and functionality. Effects according to aspects of the present disclosure are not limited to the above description more various effects will be apparent in following description.

DETAILED DESCRIPTION

Figure 1:
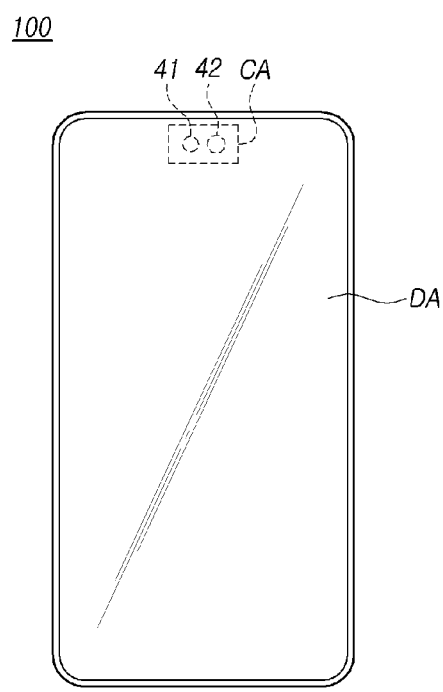
FIG. 1 illustrates schematically a display device according to aspects of the present disclosure.

The advantages and features of the present disclosure and methods of achieving the same will be apparent by referring to embodiments of the present disclosure as described below in detail in conjunction with the accompanying drawings. However, the present disclosure is not limited to the embodiments set forth below, but may be implemented in various different forms. The following embodiments are provided only to completely disclose the present disclosure and inform those skilled in the art of the scope of the present disclosure, and the present disclosure is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some embodiments of the present disclosure rather unclear. The terms such as "including", "having", "containing", "comprising of", and "consist of" used herein are generally intended to allow other components to be added unless the terms are used with the term "only". Singular forms used herein are intended to include plural forms unless the context clearly indicates otherwise. In interpreting any elements or features of the embodiments of the present disclosure, it should be considered that any dimensions and relative sizes of layers, areas and regions include a tolerance or error range even when a specific description is not conducted.

Spatially relative terms, such as, "on", "over", "above", "below", "under", "beneath", "lower", "upper", "near", "close", "adjacent", and the like, may be used herein to describe one element or feature's relationship to another element(s) or feature(s) as illustrated in the figures, and it should be interpreted that one or more elements may be further "interposed" between the elements unless the terms such as 'directly', "only" are used. A location, arrangement, or disposition of a first element or layer "on" a second element or layer may include that not only is the first element or layer located, arranged, or disposed directly on the second element or layer, but a third element or layer is interposed between the first element or layer and the second element or layer. Herein, situations in which two or more elements included in embodiments of the present disclosure are connected, combined, coupled, contacted, or the like may include not only directly or physically connecting, combining, coupling, or contacting between two or more elements, but interposing of another element between the two or more elements.

When the terms, such as "first", "second", or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

The size and thickness of each component shown in the drawings are illustrated for convenience of description, and thus, embodiments of the present disclosure are not necessarily limited thereto. Hereinafter, with reference to the accompanying drawings, various embodiments of the present disclosure will be described in detail.

Figure 2:
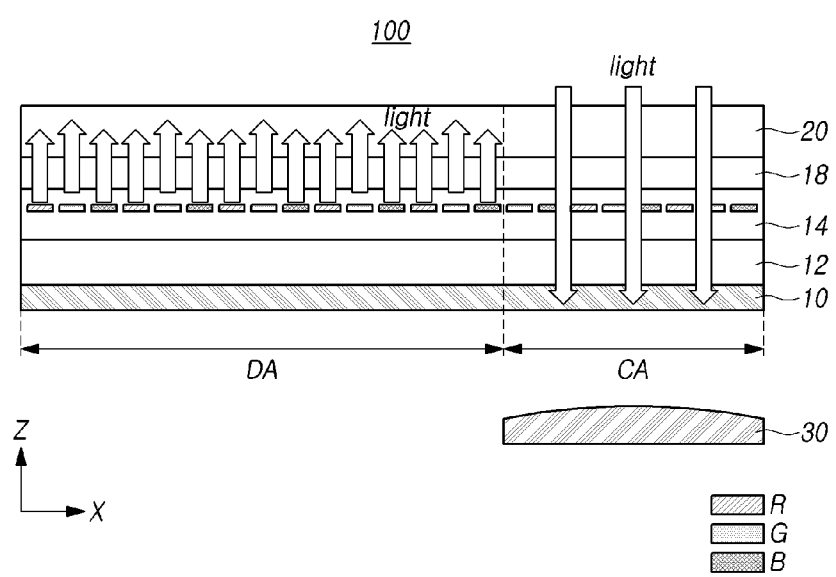
FIG. 2 is a cross-sectional view illustrating schematically a display panel and an optical sensor included in the display device according to aspects of the present disclosure.
Figure 3:
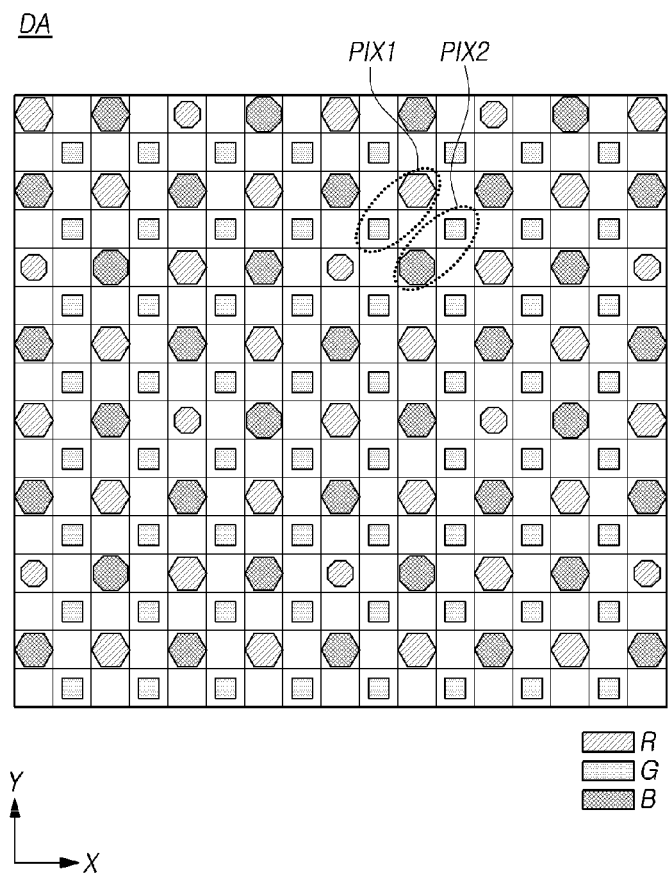
FIG. 3 illustrates pixels disposed in a display area of a display panel according to aspects of the present disclosure.

FIG. 1 illustrates schematically a display device according to aspects of the present disclosure. FIG. 2 is a cross-sectional view illustrating schematically a display panel and an optical sensor included in the display device. FIG. 3 illustrates pixels disposed in a display area of the display panel.

Referring to FIG. 1, the entirety of a surface of the display device 100, or most of the surface, may serve as a display area. The display area may include a first area DA and a second area CA. In this instance, both the first area DA and the second area CA can present images, but may have different resolutions from each other. For example, the resolution of multiple second pixels disposed in the second area CA may be lower than the resolution of multiple first pixels disposed in the first area DA. A sufficient amount of light corresponding to a degree to which the resolution of multiple second pixels disposed in the second area CA is lowered can be allowed to enter one or more sensors (41, 42) disposed in the second area CA. However, embodiments of the present disclosure are not limited thereto. For example, if the second area CA has sufficient light transmittance, or a suitable noise compensation algorithm is implemented, the resolution of the second area CA may be substantially equal to the resolution of the first area DA.

The second area CA may be an area in which one or more sensors (41, 42) are disposed. The second area CA is an area overlapping one or more sensors; therefore, may have an area smaller than the first area DA in which most images are displayed. Each sensor (41, 42) may include at least one of an image sensor, a proximity sensor, an illuminance sensor, a gesture sensor, a motion sensor, a fingerprint recognition sensor, and a biometric sensor. For example, a first sensor 41 may be an illuminance sensor, and a second sensor 42 may be an image sensor for capturing images or videos; however, embodiments of the present disclosure are not limited thereto.

The second area CA may be placed at a location where the entrance of light is required. For example, the second area CA may be placed in an upper left portion or upper right portion of a display area, or placed across the entirety of an upper portion of the display area or most of the upper portion. In these situations, respective widths of these portions may be variously changed according to desired requirements. However, embodiments described herein are not limited thereto. For example, the second area CA may be placed in a central area or lower area of the display area. Hereinafter, the first area DA may be referred to as a display area, and the second area CA may be referred to as an imaging area.

The display area DA and the imaging area CA each may include one or more pixel arrays in which pixels to which pixel data are written are arranged. The number of pixels per unit area (e.g., Pixels Per Inch, PPI) of the imaging area CA may be lower than the PPI of the display area DA in order to ensure sufficient light transmittance.

Since both the display area DA and the imaging area CA include pixels, input images can be reproduced on the display area DA and the imaging area CA. Each of pixels in the display area DA and the imaging area CA may include sub-pixels having different colors to implement images with colors. Each sub-pixel may be one of a red sub-pixel (hereinafter, referred to as "R sub-pixel"), a green sub-pixel (hereinafter, referred to as "G sub-pixel"), and a blue sub-pixel (hereinafter, referred to as "B sub-pixel"). Although not shown, each pixel P may further include a white sub-pixel (hereinafter, referred to as "W sub-pixel"). Each sub-pixel may include a pixel circuit and a light emitting element, such as a light emitting diode, more specifically, an organic light emitting diode (OLED).

The display panel has a width in the X-axis direction, a length in the Y-axis direction, and a thickness in the Z-axis direction. The display panel may include a circuit layer 12 disposed on or over a substrate 10 and a light emitting element layer 14 disposed on or over the circuit layer 12. A polarizing layer 18 may be disposed on or over the light emitting element layer 14, and a cover glass 20 may be disposed on or over the polarizing layer 18.

The circuit layer 12 may include lines such as data lines, gate lines, and power lines, a pixel circuit connected to such lines, a gate driver connected to the gate lines, and the like. The circuit layer 12 may include circuit elements such as at least one transistor implemented as a thin film transistor (TFT), a capacitor, and the like. The lines and circuit elements of the circuit layer 12 may be implemented or disposed in or through a plurality of insulating layers, two or more metal layers separated by an insulating layer therebetween, and an active layer including a semiconductor material.

The light emitting element layer 14 may include a light emitting element driven by the pixel circuit, for example, a light emitting diode, more specifically an organic light emitting diode (OLED), or the like. In one embodiment, the light emitting element may be implemented as the organic light emitting diode (OLED). The OLED may include an organic material layer formed between an anode and a cathode. The organic material layer may include a hole injection layer (HIL), a hole transport layer (HTL), an emission layer (EML), an electron transport layer (ETL), and an electron injection layer (EIL); however, embodiments of the present disclosure are not limited thereto. When voltages are applied to the anode and cathode of the OLED, holes passing through the hole transport layer (HTL) and electrons passing through the electron transport layer (ETL) can move to the emission layer (EML), and then form excitons. Thereby, visible light can be emitted from the emission layer (EML). The light emitting element layer 14 may be disposed on or over pixels that selectively transmit respective wavelengths of red light, green light, and blue light, and further include a color filter array.

The light emitting element layer 14 may be covered by an encapsulation layer. The encapsulation layer may have a structure in which an organic film and an inorganic film are alternately stacked. In this instance, the inorganic film may serve to block the penetration of moisture or oxygen, and the organic film may serve to flatten a surface of the inorganic film. In the structure having the multilayer stacked with one or more organic films and one or more inorganic films, a path through which moisture or oxygen travels may become longer than that in a structure having a single layer, and therefore, the penetration of moisture/oxygen affecting the light emitting element layer 14 can be effectively prevented.

The polarizing layer 18 may be bonded on the light emitting element layer 14 or the encapsulation layer. The polarizing layer 18 can serve to improve outdoor visibility of the display device. The polarizing layer 18 can serve to reduce light reflected from the surface of the display panel and block light reflected from the metal of the circuit layer 12 to improve brightness of pixels. The polarizing layer 18 may be implemented as a linear polarizing plate 18, a polarizing plate 18 on which a phase delay film is bonded, or a circular polarizing plate 18.

The display device 100 according to aspects of the present disclosure may include an optical sensor disposed under a display screen. The optical sensor can capture external images in a capture mode and supply still and/or video image data. The optical sensor may correspond to, and be located under, the imaging area CA. In one embodiment, a lens 30 of the optical sensor may face the imaging area CA. The external light may enter the lens of the optical sensor through the imaging area CA, and the lens 30 may condense the light to the image sensor. Meanwhile, in a situation where the resolution of the imaging area CA is reduced to ensure light transmittance, an image quality compensation algorithm may be applied for compensating for the luminance and color coordinates of pixels in the imaging area CA.

According to embodiments described herein, as pixels are also disposed in the imaging area CA, a full-screen display can be implemented without limitation in the display area due to an optical sensor.

As illustrated in FIG. 3, the display area DA may include pixels arranged in a matrix pattern. Each of the pixels may be implemented as a real-type pixel including R, G, and B sub-pixels of three primary colors, which make up one pixel. Each of the pixels may further include a W sub-pixel omitted in the drawing. Further, two sub-pixels may make up one pixel using a sub-pixel rendering algorithm. For example, a first pixel PIX1 may be made up of R and G sub-pixels, and a second pixel PIX2 may be made up of B and G sub-pixels. Insufficient color representation in each of the pixels PIX1 and PIX2 may be compensated for by an average value of corresponding color data between neighboring pixels.

Figure 4:
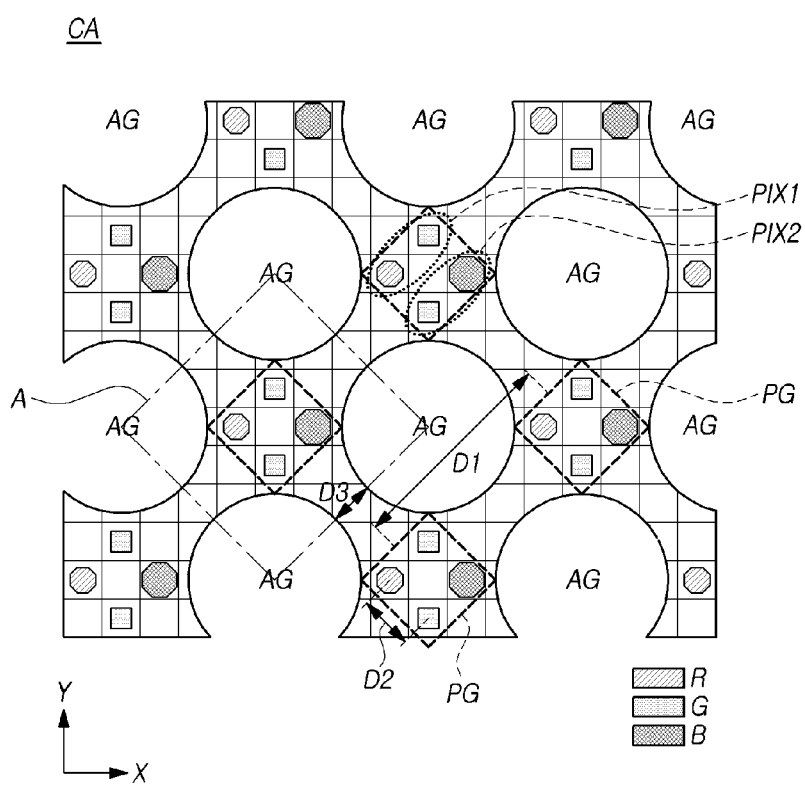
FIG. 4 illustrates pixels in an imaging area, and a light-transmitting area according to aspects of the present disclosure.
Figure 5:
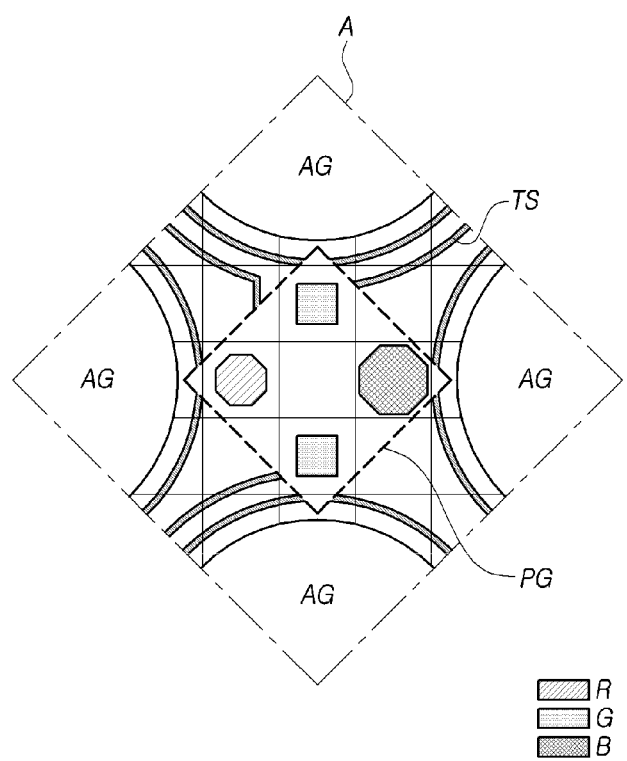
FIG. 5 is an enlarged view for portion A of FIG. 4.

FIG. 4 illustrates an imaging area according to aspects of the present disclosure. FIG. 5 is an enlarged view for portion A of FIG. 4.

Referring to FIGS. 4 and 5, the imaging area CA may include one or more pixel groups PG, each of which includes one or more pixels, spaced apart by a predetermined distance D1 from one another, and one or more light-transmitting areas AG disposed between neighboring pixel groups PG. The light-transmitting area AG may be disposed between pixels. Thereby, more sufficient external light can enter the lens of the optical sensor through the light-transmitting area AG. A shape of the light-transmitting area AG is illustrated in a circular shape; however, embodiments of the present disclosure are not limited thereto. For example, the light-transmitting area AG may be designed in various shapes such as a circle, an ellipse, a polygon, and the like.

The light-transmitting area AG may include one or more transparent materials having high light transmittance for enabling light to enter the light-transmitting area AG such that a loss of the incident light is minimized. For example, the light-transmitting area AG may include transparent insulating materials without including metal lines or pixels. In one embodiment, the lines TS of the pixels may be disposed outside of the light-transmitting area AG. However, embodiments herein are not limited thereto; for example, a metal electrode material may remain in a partial area in the light-transmitting area AG. In this manner, the amount of light incident on the sensor through the light-transmitting area can increase, and the light transmittance of the imaging area CA can increase as the light-transmitting area AG increases.

Each pixel group PG may include one or two pixels. Further, each of the pixels may include two to four sub-pixels. For example, each pixel in each pixel group may include all of the R, G, and B sub-pixels, or may include two of the R, G, and B sub-pixels. According to implementations, each pixel may further include W sub-pixel.

A distance D3 between the light-transmitting areas AG may be smaller than a distance (e.g., a pitch) D1 between the pixel groups PG. A distance D2 between the sub-pixels may be smaller than the distance D1 between the pixel groups PG.

Figure 6:
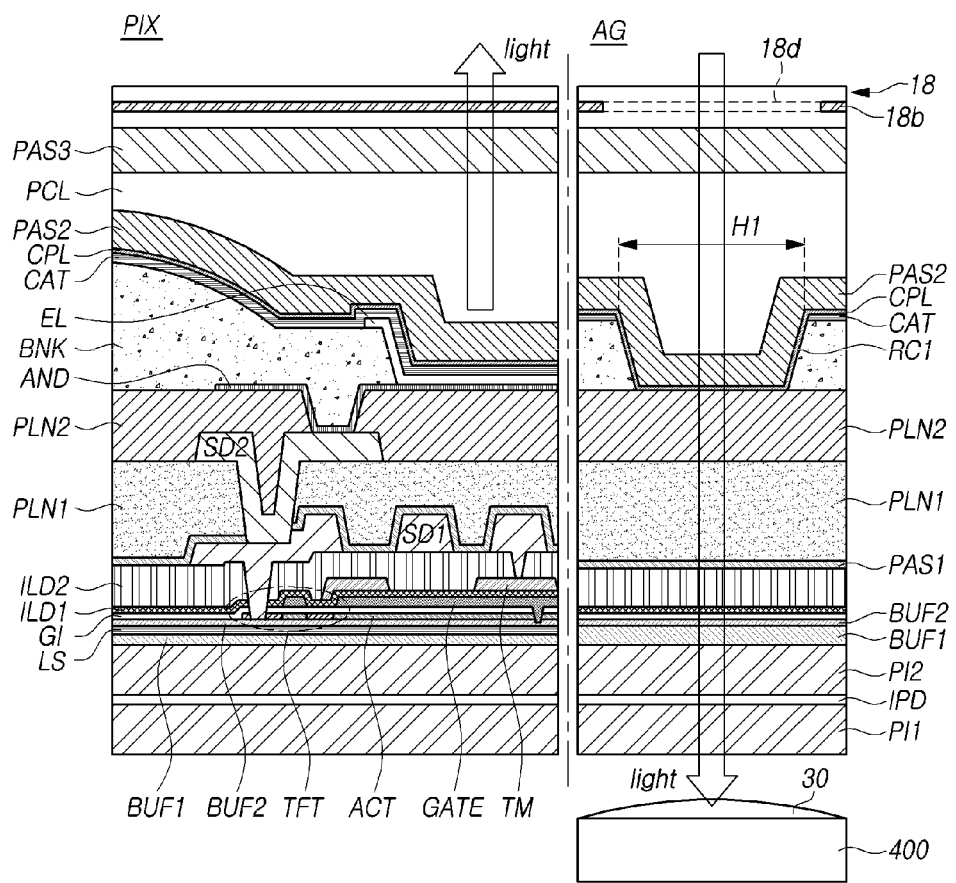
FIG. 6 illustrates a cross-sectional structure of a pixel area and a light-transmitting area according to aspects of the present disclosure.

FIG. 6 illustrates a cross-sectional structure of a pixel area and a light-transmitting area according to aspects of the present disclosure.

Cross-sectional structures of the display device 100 according to embodiments described herein are not limited to the structure in FIG. 6. FIG. 6 illustrates a driving transistor DT of a pixel circuit. Referring to FIG. 6, a circuit layer, a light emitting element layer, and the like may be stacked on or over at least one substrates (PI1, PI2) in a pixel area PIX. The substrate may include a first PI substrate PI1 and a second PI substrate PI2. An inorganic film IPD may be disposed between the first PI substrate PI1 and the second PI substrate PI2. The inorganic film IPD can block the penetration of moisture.

A first buffer layer BUF1 may be disposed on the second PI substrate PI2. A first metal layer LS may be disposed on the first buffer layer BUF1, and a second buffer layer BUF2 may be disposed on the first metal layer LS. Each of the first and second buffer layers BUF1 and BUF2 may be formed of an inorganic insulating material, and may include one or more insulating layers.

The first metal layer LS may be patterned in a photolithography process. The first metal layer LS may include a light shield pattern. The optical shield pattern can block external light so that light cannot be irradiated to an active layer of the transistor, such as a thin film transistor (TFT), thereby preventing a photo current of the TFT disposed in the pixel area. When the light shield pattern is formed of a metal having a lower absorption coefficient of a laser wavelength used in a laser ablation process than a metal layer (e.g., a cathode electrode) to be removed from the imaging area CA, the light shield pattern may also serve as a shielding layer that blocks a corresponding laser beam LB in the laser ablation process.

The active layer ACT may be formed of a semiconductor material on the second buffer layer BUF2 and patterned by a photo-lithography process. The active layer ACT may include an active pattern of each of one or more TFTs of the pixel circuit and one or more TFTs of a gate driver. A part of the active layer ACT may be metalized by ion doping. The metalized part may be used as a jumper pattern for connecting metal layers at some nodes of the pixel circuit, thus connecting one or more elements of the pixel circuit.

A gate insulating layer GI may be disposed on the second buffer layer BUF2 to cover the active layer ACT. The gate insulating layer GI may be formed of an inorganic insulating material.

A second metal layer GATE may be disposed on the second gate insulating layer GI. The second metal layer GATE may be patterned by the photolithography process. The second metal layer GATE may be used as a gate line, a gate electrode, a lower electrode of a storage capacitor Cst1, a jumper pattern connecting respective patterns of the first metal layer LS and a third metal layer TM, or the like.

A first interlayer insulating layer ILD1 may be disposed on the gate insulating layer GI to cover the second metal layer GATE. The third metal layer TM may be disposed on the first interlayer insulating layer ILD2, and a second interlayer insulating layer ILD2 may cover the third metal layer TM. The third metal layer TM may be patterned by the photolithography process. The third metal layer TM may include metal patterns equal to those of an upper electrode of the storage capacitor Cst1. The first and second interlayer insulating layers ILD1 and ILD2 may include an inorganic insulating material.

A fourth metal layer SD1 may be disposed on the second interlayer insulating layer ILD2, and an inorganic insulating layer PAS1 and a first planarization layer PLN1 may be stacked one or over at least one of the fourth metal layer SD1 and the second interlayer insulating layer ILD2. A fifth metal layer SD2 may be disposed on the first planarization layer PLN1.

One or more patterns of the fourth metal layer SD1 may be connected to the third metal layer TM through a contact hole formed in the first planarization layer PLN1 and the inorganic insulating layer PAS1. The first and second planarization layers PLN1 and PLN2 may be formed of an organic insulating material that flattens a surface.

The fourth metal layer SD1 may include first and second electrodes of the TFT that are connected to the active pattern of the TFT through a contact hole formed in the second interlayer insulating layer ILD2. Data lines and power lines may be implemented with the fourth metal layer SD1 or the fifth metal layer SD2.

An anode electrode AND, which is a first electrode layer of a light emitting element OLED, may be disposed on the second planarization layer PLN2. The anode electrode AND may be connected to one electrode of the driving TFT through a contact hole formed in the second planarization layer PLN2. The anode electrode AND may include a transparent or translucent electrode material.

A pixel defining film BNK may cover the anode electrode AND of the light emitting element OLED. The pixel defining film BNK may be formed in a pattern defining a light emitting area (or an opening area) through which light passes from each pixel to the outside. A spacer SPC may be formed on the pixel defining film BNK. The pixel defining film BNK and the spacer SPC may be integrated with the same organic insulating material. The spacer SPC can enable a gap between a fine metal mask (FMM) and the anode electrode AND to be formed so that the FMM cannot contact the anode electrode AND in the deposition process of an organic compound EL.

The organic compound EL may be formed in a light emitting area of each pixel defined by the pixel defining film BNK. A cathode electrode CAT, which is the second electrode layer of the light emitting element OLED, may be disposed to cover the pixel defining film BNK, the spacer SPC, and the organic compound EL in the display device 100. In one embodiment, the cathode electrode CAT may be disposed in the entirety, or most, of a surface of the display device 100. The cathode electrode CAT may be connected to a VSS line formed with any one of the lower metal layers. A capping layer CPL may cover the cathode electrode CAT. The capping layer (CPL) may be formed of an inorganic insulating material, and can protect the cathode electrode CAT by blocking air and outgassing of the organic insulating material applied on the capping layer CPL from penetrating to the cathode electrode CAT.

An encapsulation layer may include inorganic insulating layers PAS2 and PASS and a foreign material compensation layer PCL disposed between the inorganic insulating layers PAS2 and PAS3. The lower inorganic insulating layer PAS2 may cover the capping layer CPL, and the foreign material compensation layer PCL may be disposed on the lower inorganic insulating layer PAS2. The foreign material compensation layer PCL may include an organic insulating material. The upper inorganic insulating layer PAS3 may be disposed on the foreign material compensation layer PCL.

A polarizing plate 18 may be disposed on the inorganic insulating layer PAS3 to improve outdoor visibility of the display device 100. The polarizing plate 18 may reduce light reflected from the surface of the display device 100 and block light reflected from the metal of the circuit layer 12, leading to improving brightness of pixels. Referring to FIG. 6, a first light-transmitting pattern 18*d* may be formed on the polarizing plate 18 in the light-transmitting area AG. The first light-transmitting pattern 18*d* may be formed due to a variance in colors of a polarizer 18*b* by a laser, or may be formed by the partial removing of the polarizer 18*b*.

An opening H1 may be formed in the cathode electrode CAT in the light-transmitting area AG. The opening H1 is formed by etching the cathode electrode CAT and the pixel defining film BNK at once after the cathode electrode CAT on the pixel defining film BNK are formed. Accordingly, a first groove RC1 may be formed in the pixel defining film BNK, and the opening H1 of the cathode electrode CAT may be formed on the first groove RC1. However, embodiments described herein are not limited thereto. For example, the pixel defining layer may not be disposed in the light-transmitting area AG, and the cathode electrode CAT may be disposed on the second planarization layer PLN2.

In some embodiments, in the light-transmitting area AG, the first light-transmitting pattern 18*d* may be disposed in the polarizing plate 18, and the opening H1 may be formed in the cathode electrode. Thereby, light transmittance can be improved. Accordingly, since a sufficient amount of light is allowed to enter a camera module 400, camera performance can be improved. Further, noise of the captured image data can be reduced.

Figure 7:
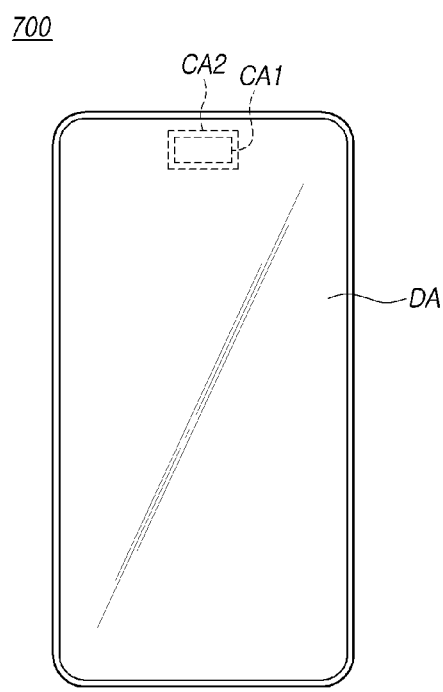
FIG. 7 is a plan view illustrating a display device according to another aspect of the present disclosure.
Figure 8:
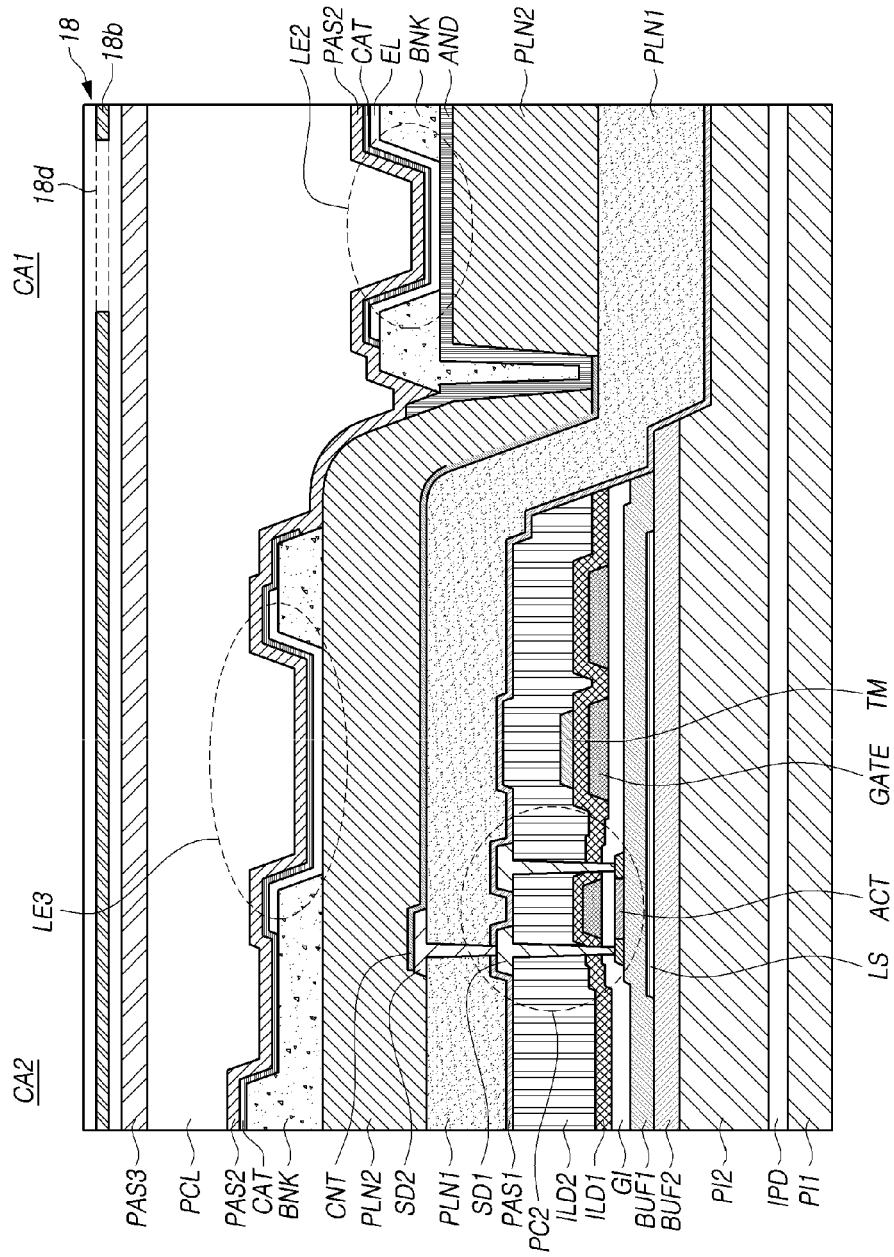
FIG. 8 is a cross-sectional view illustrating the display device another aspect of the present disclosure.

FIG. 7 is a plan view illustrating a display device according to another aspect of the present disclosure. FIG. 8 is a cross-sectional view of the display device.

The display device 700 according to embodiments described herein may include a first area DA, a second area CA1, and a third area CA2. All of the first area DA, the second area CAL and the third area CA2 are areas in which images are displayed, and the third area CA2 is an area provided for further improving the light transmittance of the second area CAL The first area DA and the second area CA1 are substantially equal to the above description discussed with reference to FIG. 1. That is, the second area CA1 is an area overlapping various sensors mounted in the display device. As described above, the resolution of the second area CA1 may be lower than that of the first area DA in order to maximize the amount of incident light entering an optical sensor under a substrate.

Although the light transmittance can be improved to some extent through such a design that allows the first area and the second area to have different resolutions, the transmittance cannot be improved above a certain level due to some elements disposed in the second area CAL In particular, circuit elements (a TFT, a capacitor, and the like) and lines disposed in the second area CA1 act as obstacles to improve the transmittance. Accordingly, design schemes were considered for further improving the transmittance by changing an arrangement of elements disposed in the second area CAE Such designs can be realized by disposing only a light emitting element in the second area CA1 and a driving circuit in the third area CA2.

As described above, the display device 700 according to embodiments described herein includes a plurality of first pixels disposed in a first area DA, a plurality of second pixels disposed in a second area CA1 surrounded by the first area, and a plurality of third pixels disposed in a third area CA2 between the first area and the second area. The third area CA2 may surround the second area CAE In FIG. 7, although the second area CA1 and the third area CA2 have the same planar shape (square), embodiments of the present disclosure are not limited thereto. For example, the second area CA1 and the third area CA2 may have different shapes in a plan view.

The second area CA1 may overlap an optical sensor (e.g., a camera module). In one embodiment, a density of the second pixels disposed in the second area CA1 may be lower than a density of the first pixels disposed in the first area DA for enabling a certain level of transmittance to be established.

Only a light emitting element LE2 (e.g., an OLED) of each of the second pixels may be disposed in the second area CAL and a pixel circuit PC2 driving the light emitting element LE2 of each of the second pixels may be disposed in the third area CA2 different from the second area CA1.

Referring to FIG. 8, when the light emitting element and the driving circuit for driving the light emitting element are disposed in different areas, this configuration becomes different from a configuration of a light emitting element and a related pixel circuit disposed together in an area. In particular, the display device 700 according to embodiments described herein may further include a connection electrode CNT for connecting between a light emitting element LE2 of each of the second pixels and a pixel circuit PC2 corresponding to the light emitting element LE2. The connection electrode CNT can electrically connect between the light emitting element LE2 in the second area CA1 and the pixel circuit PC2 in the third area CA2 for driving the light emitting element LE2. The connection electrode CNT may be formed of a transparent metal such as Indium Tin Oxide (ITO) or Indium Zinc Oxide (MO).

Meanwhile, as shown in FIG. 4 or 5, the second area CA1 may include a light-transmitting area AG disposed between the second pixels. In one embodiment, a cathode CAT of a light emitting element LE2 included in the second pixels may not be disposed in the light transmitting area AG. That is, such a cathode may be patterned in the second area CA1.

A density of the third pixels disposed in the third area CA2 may be the same as a density of the second pixels disposed in the second area CAE That is, the resolution of the third area CA2 may be lower than that of the first area DA. This embodiment has an advantage of providing a spatial margin sufficient to dispose a pixel circuit for driving a light emitting element in the second area CAE However, in another embodiment, a density of the third pixels disposed in the third area CA2 may be the same as a density of the first pixels disposed in the first area DA, or be different from respective densities of the first area DA and the second area CAE A light emitting element LE3 (e.g., an OLED) of each of the third pixels and a pixel circuit (not shown) driving the light emitting element LE3 may be located in the third area CA2. The pixel circuit for driving the light emitting element LE3 of each of the third pixels may have a structure different from a pixel circuit PC2 for driving a light emitting element LE2 of each of the second pixels. For example, the pixel circuit of the third area CA2 may have a 6T1C (T for transistor and C for capacitor) structure, and the pixel circuit of the second area CA1 may have a 7T1C structure. Furthermore, as the pixel circuit of the first area DA has a 5T2C structure, all three areas may have different pixel circuit structures.

The third area may include a light-transmitting area AG disposed between the third pixels. In this embodiment, a cathode CAT of a light emitting element LE3 included in each of the third pixels may not be disposed in the light-transmitting area AG. That is, the cathode may be patterned in the third area CA2.

In the display device according to aspect of present disclosure, since a sufficient amount of light is allowed to enter the optical sensor through the above-described configurations, image quality can be improved, and noises of captured image data can be reduced.

The above description has been presented to enable any person skilled in the art to make and use the invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

The scope of protection of the present disclosure is to be construed according to the claims, and all technical ideas within the scope of the claims should be interpreted as being included in the scope of the present invention.

What is claimed is:

1. A display device comprising:
a plurality of first pixels disposed in a first area;
a plurality of second pixels disposed in a second area completely surrounded by the first area; and
a plurality of third pixels disposed in a third area between the first area and the second area, the third area completely surrounded by the first area,
wherein pixel driving circuits configured to drive the plurality of second pixels are in the third area but not in the second area.

2. The display device according to claim 1, wherein the second area overlaps a camera module, and
wherein a density of the second pixels disposed in the second area is lower than a density of the first pixels disposed in the first area.

3. The display device according to claim 2, wherein a density of the third pixels disposed in the third area is substantially a same as the density of the second pixels disposed in the second area.

4. The display device according to claim 1, wherein each of the second pixels comprises a light emitting element but not the pixel driving circuits.

5. A display device comprising:
a plurality of first pixels disposed in a first area;
a plurality of second pixels disposed in a second area surrounded by the first area; and
a plurality of third pixels disposed in a third area between the first area and the second area,
wherein each of the second pixels comprises a light emitting element only, and
wherein a pixel circuit for driving the light emitting element of each of the second pixels is disposed in the third area.

6. The display device according to claim 5, further comprising a connection electrode for connecting between the light emitting element in the second area and the pixel circuit in the third area corresponding to the light emitting element in the second area.

7. The display device according to claim 6, wherein the connection electrode is formed of a transparent metal.

8. The display device according to claim 5, wherein the pixel circuit for driving the light emitting element of each of the second pixels has a structure different from a pixel circuit for driving a light emitting element of each of the third pixels.

9. A display device comprising:
a plurality of first pixels disposed in a first area;
a plurality of second pixels disposed in a second area surrounded by the first area; and
a plurality of third pixels disposed in a third area between the first area and the second area,
wherein a light emitting element of each of the plurality of third pixels and a pixel circuit for driving the light emitting element of each of the plurality of third pixels are located in the third area and a light emitting element of each of the plurality of second pixels is in the second area and a pixel circuit for driving the light emitting element of each of the plurality of second pixels is located in the third area but not in the second area.

10. A display device comprising:
a plurality of first pixels disposed in a first area;
a plurality of second pixels disposed in a second area surrounded by the first area; and
a plurality of third pixels disposed in a third area between the first area and the second area,
wherein the second area includes a light-transmitting area disposed between the second pixels, and
wherein a cathode of a light emitting element included in each of the second pixels is not disposed in the light-transmitting area.

11. The display device according to claim 10, wherein the third area includes a light-transmitting area disposed between the third pixels, and
wherein a cathode of a light emitting element included in each of the third pixels is not disposed in the light-transmitting area.

* * * * *